(12) United States Patent
An

(10) Patent No.: US 9,202,534 B2
(45) Date of Patent: Dec. 1, 2015

(54) SEMICONDUCTOR MEMORY DEVICE PERFORMING PRE-READ AND MAIN READ, MEMORY SYSTEM INCLUDING THE SAME AND METHOD OF OPERATING THE SAME

(71) Applicant: SK hynix Inc., Icheon-si Gyeonggi-do (KR)

(72) Inventor: Chi Wook An, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 289 days.

(21) Appl. No.: 13/803,493

(22) Filed: Mar. 14, 2013

(65) Prior Publication Data
US 2014/0140148 A1 May 22, 2014

(30) Foreign Application Priority Data
Nov. 20, 2012 (KR) ........................ 10-2012-0131766

(51) Int. Cl.
G11C 7/00 (2006.01)
G11C 7/10 (2006.01)
G11C 11/56 (2006.01)
G11C 16/04 (2006.01)
G11C 16/06 (2006.01)
G11C 7/22 (2006.01)

(52) U.S. Cl.
CPC ............ G11C 7/106 (2013.01); G11C 11/5642 (2013.01); G11C 16/0483 (2013.01); G11C 16/06 (2013.01); G11C 7/22 (2013.01)

(58) Field of Classification Search
CPC ....... G11C 7/22; G11C 7/1072; G11C 7/2006
USPC .............. 365/189.14, 189.05, 185.08, 189.01
See application file for complete search history.

(56) References Cited

U.S. PATENT DOCUMENTS

| 7,668,023 B2 * | 2/2010 | Seong ...................... 365/189.05 |
| 2007/0028155 A1 * | 2/2007 | Kim et al. ...................... 714/755 |
| 2010/0074011 A1 * | 3/2010 | Kang et al. ............... 365/185.03 |
| 2011/0103152 A1 | 5/2011 | Yoshihara et al. |
| 2014/0063949 A1 * | 3/2014 | Tokiwa .................... 365/185.11 |

FOREIGN PATENT DOCUMENTS

KR    1020100129080 A    12/2010

* cited by examiner

*Primary Examiner* — Connie Yoha
(74) *Attorney, Agent, or Firm* — William Park & Associates Ltd.

(57) ABSTRACT

A method of operating a semiconductor memory device includes performing a pre-read and a first main read to selected memory cells in response to a read request, and performing a second main read to the selected memory cells in response to a re-read request.

19 Claims, 11 Drawing Sheets

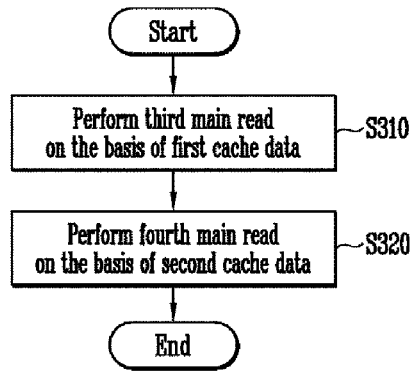
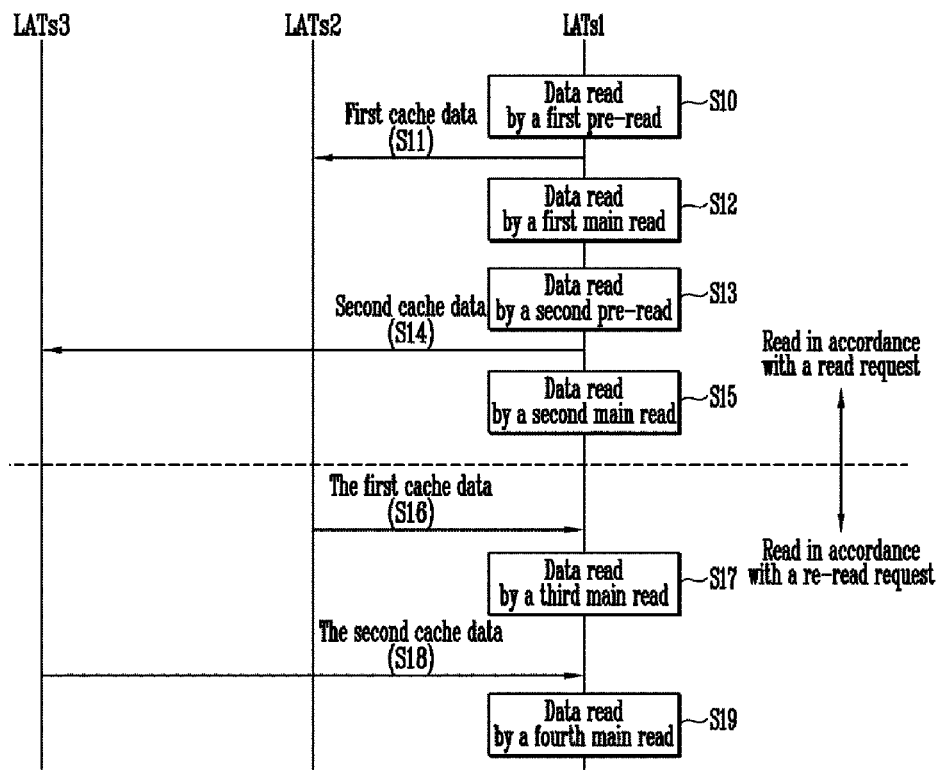

SEMICONDUCTOR MEMORY DEVICE PERFORMING PRE-READ AND MAIN READ, MEMORY SYSTEM INCLUDING THE SAME AND METHOD OF OPERATING THE SAME

CROSS-REFERENCE TO RELATED APPLICATION

This application claims priority from Korean Patent Application No. 10-2012-0131766, filed on Nov. 20, 2012, the contents of which are incorporated herein by reference in its entirety.

BACKGROUND

1. Technical Field

The present invention generally relates to an electronic equipment, more particularly relates to a semiconductor memory device and a memory system including the same.

2. Related Art

A semiconductor memory device may mean a memory device that is embodied by using a semiconductor such as silicon Si, germanium Ge, gallium arsenide GaAs, indium phosphide Inp, etc. The semiconductor memory device may be divided into a volatile memory device and a non-volatile memory device.

The volatile memory device may mean a memory device where stored data may get lost if the supply of a power is blocked. The volatile memory device may include a static RAM SRAM, a dynamic RAM DRAM, a synchronous DRAM SDRAM and so on. The non-volatile memory device may indicate a memory device where stored data remains even though the power supply may be blocked from the device. The non-volatile memory device may include a read only memory ROM, a programmable ROM PROM, an electrically programmable ROM EPROM, an electrically erasable and programmable ROM EEPROM, a flash memory, a phase-change RAM PRAM, a magnetic RAM MRAM, a resistive RAM RRAM, a ferroelectric RAM FRAM, etc. The flash memory device may be divided into a NOR type memory device and a NAND type memory device.

SUMMARY OF THE INVENTION

Embodiments provide a semiconductor memory device having enhanced operation velocity, a memory system including the same and a method of operating the same.

A method of operating a semiconductor memory device according to an embodiment includes performing a pre-read and a first main read based on the pre-read to selected memory cells in response to read request, data read by the pre-read being stored as cache data; receiving re-read request; and performing a second main read to the selected memory cells on the basis of the cache data, in response to the re-read request.

The pre-read to the selected memory cells is omitted in the performing of the second main read.

A method of operating a memory system according to an embodiment includes performing a first pre-read and a first main read based on the first pre-read when a first read voltage is supplied to a word line of selected memory cells, data read by the first pre-read being stored as first cache data; performing a second pre-read and a second main read based on the second pre-read when a second read voltage is supplied to the word line, data read by the second pre-read being stored as second cache data; adjusting the first read voltage and the second read voltage; performing a third main read based on the first cache data when the adjusted first read voltage is supplied to the word line; and performing a fourth main read based on the second cache data when the adjusted second read voltage is supplied to the word line.

A pre-read to the selected memory cell is omitted in the performing of the third main read and the performing of the fourth main read.

A memory system according to an embodiment includes a semiconductor memory device including memory cells and a read and write circuit coupled to the memory cells through bit lines; and a controller configured to control the semiconductor memory device. Here, the semiconductor memory device is configured to perform a first pre-read and a first main read based on the first pre-read to the selected memory cells in response to a read request from the controller, and data read by the first pre-read is stored as first cache data in the read and write circuit.

In an embodiment, the controller transmits a re-read request to the semiconductor memory device, and the semiconductor memory device is configured to perform a second main read to the selected memory cell based on the first cache data in response to the re-read request.

In an embodiment, the read and write circuit includes page buffers coupled to the bit lines, respectively, and the page buffers includes first latches and second latches. Data read by the first pre-read is stored in the first latches, the first main read is performed based on the data stored in the first latches, and the data stored in the first latches is copied as the first cache data in the second latches before the first main read is performed.

In an embodiment, the first cache data is transmitted from the second latches to the first latches when the re-read request is received, and the second main read is performed based on the cache data stored in the first latches.

A method of reading a semiconductor memory device according to an embodiment includes performing a pre-read to selected memory cells when a first read voltage is supplied to a word line coupled to the selected memory cells; storing data read by the pre-read as cache data; performing a first main read on the basis of the pre-read; and performing a second main read to the selected memory cells on the basis of the cache data when a second read voltage is supplied to the word line.

In an embodiment, the method further includes adjusting the first read voltage and the second read voltage; performing a third main read to the selected memory cells based on the cache data when the adjusted first read voltage is supplied to the word line; and performing a fourth main read to the selected memory cells based on the cache data when the adjusted second read voltage is supplied to the word line.

A semiconductor memory device according to an embodiment includes memory cells defined as a multi level cells; and a read and write circuit including latches coupled to the memory cells through bit lines, and configured to perform a pre-read and a first main read based on the pre-read to selected memory cells in a read operation using a first read voltage. Here, data read by the pre-read is stored as cache data in the latches before the first main read is performed, and the read and write circuit is configured to perform a second main read to the selected memory cells on the basis of the cache data in a read operation using the second read voltage.

A memory system according to an embodiment includes a semiconductor memory device including memory cells and a read and write circuit coupled to the memory cells through bit lines; and a controller configured to control the semiconductor memory device through a memory interface which interfaces with the semiconductor memory device, wherein the semiconductor memory device is configured to detect data of selected memory cells by performing a pre-read and a first main read based on the pre-read to the selected memory cells in response to a read request from the controller, and data read by the pre-read is stored as cache data in the read and write circuit.

A memory system according to an embodiment includes a semiconductor memory device including semiconductor memory chips, each semiconductor memory chip including memory cells and a read and write circuit coupled to the memory cells through bit lines; a controller configured to control the semiconductor memory device; and groups of semiconductor memory chips configured to communicate with the controller through respective channels, wherein each of the semiconductor memory chips are configured to detect data of selected memory cells by performing a pre-read and a first main read based on the pre-read to the selected memory cells in response to a read request from the controller, and data read by the pre-read is stored as cache data in the read and write circuit.

A computing system according to an embodiment includes a memory system electrically coupled to a central processing unit, a RAM, a user interface, and a power supply through a system bus; wherein the memory system includes: a semiconductor memory device including semiconductor memory chips, each semiconductor memory chip including memory cells and a read and write circuit coupled to the memory cells through bit lines; a controller configured to control the semiconductor memory device; and groups of semiconductor memory chips configured to communicate with the controller through respective channels, wherein each of the semiconductor memory chips are configured to detect data of selected memory cells by performing a pre-read and a first main read based on the pre-read to the selected memory cells in response to a read request from the controller, and data read by the pre-read is stored as cache data in the read and write circuit.

The embodiments provide a semiconductor memory device having enhanced operation velocity, a memory system including the same and a method of operating the same.

BRIEF DESCRIPTION OF THE DRAWINGS

The above and other features and advantages of the embodiments will become readily apparent by reference to the following detailed description when considered in conjunction with the accompanying drawings wherein:

FIG. 8 is a flowchart illustrating in detail the step S150 in FIG. 6;

FIG. 9 is a view illustrating data flow between the first to the third latches LATs1~LATs3 when read operations are performed in response to read request and re-read request;

DETAILED DESCRIPTION

Hereinafter, the preferred embodiments will be explained in more detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Figure 1:
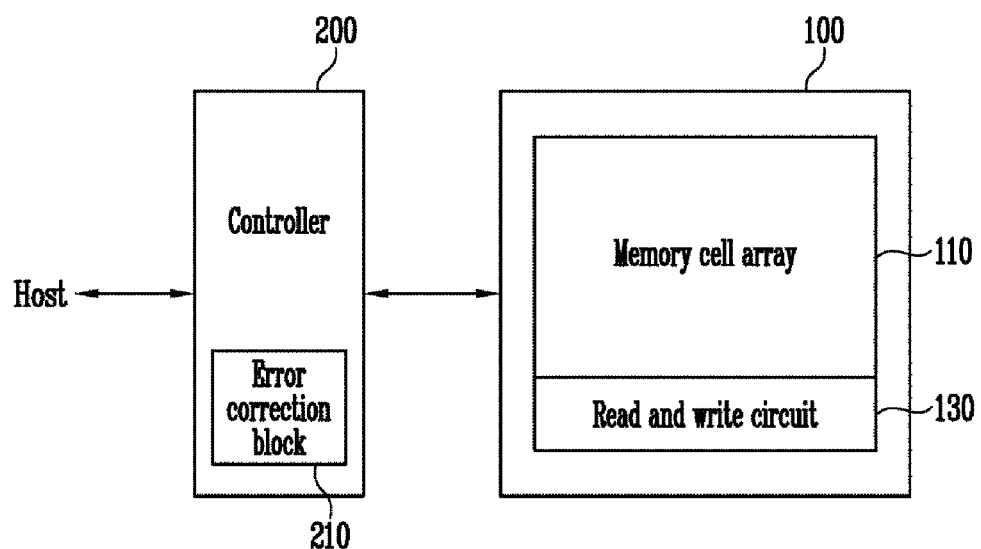
FIG. 1 is a block diagram illustrating a memory system including a semiconductor memory device.

FIG. 1 is a block diagram illustrating a memory system including a semiconductor memory device.

In FIG. 1, a memory system 10 may include a semiconductor memory device 100 and a controller 200. The semiconductor memory device 100 may include a memory cell array 110 and a read and write circuit 130 coupled to the memory cell array 110.

The memory cell array 110 may include memory cells. Each of the memory cells may be a single level memory cell for storing one data bit or a multi level memory cell for storing two or more data bits.

The semiconductor memory device 100 may operate in response to the control of the controller 200. The semiconductor memory device 100 may perform a read operation in response to a read request of the controller 200. In the event that the semiconductor memory device 100 receives a read command and an address from the controller 200, it may perform a pre-read and a main read based on the pre-read to memory cells (selected memory cells) corresponding to the address.

For example, in the event that the semiconductor memory device 100 receives a read request about least significant bit data of the selected memory cells, it detects data of the selected memory cells by performing one pre-read and one main read, and transmits the detected data to the controller 200. In the event that the semiconductor memory device 100 receives a read request about most significant bit data of the selected memory cells, it may perform a first pre-read and a first main read based on the first pre-read, and may perform a second pre-read and a second main read based on the second pre-read. The semiconductor memory device 100 may detect the most significant bit data of the selected memory cells according to the result of the first main read and the second main read, and may provide the detected data to the controller 200. That is, the semiconductor memory device 100 may perform at least one pre-read and one or more main read based on the pre-read when the read request is received from the controller 200.

In an embodiment, data read by the pre-read is stored as cache data in the read and write circuit 130. In an embodiment, the cache data may remain in the read and write circuit 130 until another command, not a re-read request, is received from the controller 200. Here, the re-read request may mean a read request about the same memory cells.

In an embodiment, the semiconductor memory device 100 may be a flash memory device. However, it would be understood that the semiconductor memory device 100 of the present embodiments not limited as a flash memory device.

The controller 200 may be coupled between the semiconductor memory device 100 and a host. The controller 200 may interface the host with the semiconductor memory device 100. For example, when a read operation or a program operation is performed according to a request from the host, the controller 200 may convert a logical block address received from the host into a physical block address, and may provide the physical block address to the semiconductor memory device 100 with the corresponding command.

The controller 200 may transmit a re-read request to the semiconductor memory device 100 in response to various causes, after it provides the read request to the semiconductor memory device 100. In an embodiment, the controller 200 may include an error correction block 210. The error correction block 210 detects and corrects error of data received from the semiconductor memory device 100. Error correction function performed by the error correction block 210 may be determined according to the number of error bits in the data received from the semiconductor memory device 100. The error correction block 210 detects and corrects the error when the number of error bits in the data received from the semiconductor memory device 100 is smaller than a specified value. The error correction block 210 does not perform detection and correction of error in the event that the number of error bits in the data received from the semiconductor memory device 100 is higher than the specified value. In this case, the controller 200 may control the semiconductor memory device 100 to adjust a voltage supplied to a selected word line. The controller 200 may transmit the re-read request to the semiconductor memory device 100.

In the event that the re-read request is received, the semiconductor memory device may read the data again in the selected memory cells. In an embodiment, the pre-read may be omitted in the read operation performed in response to the re-read request. The main read may be performed on the basis of the cache data stored in the read and write circuit 130, instead of the pre-read.

As a result, velocity of the read performed in response to the re-read request may be enhanced. Accordingly, the embodiments provide a semiconductor memory device having enhanced operation velocity.

Figure 2:
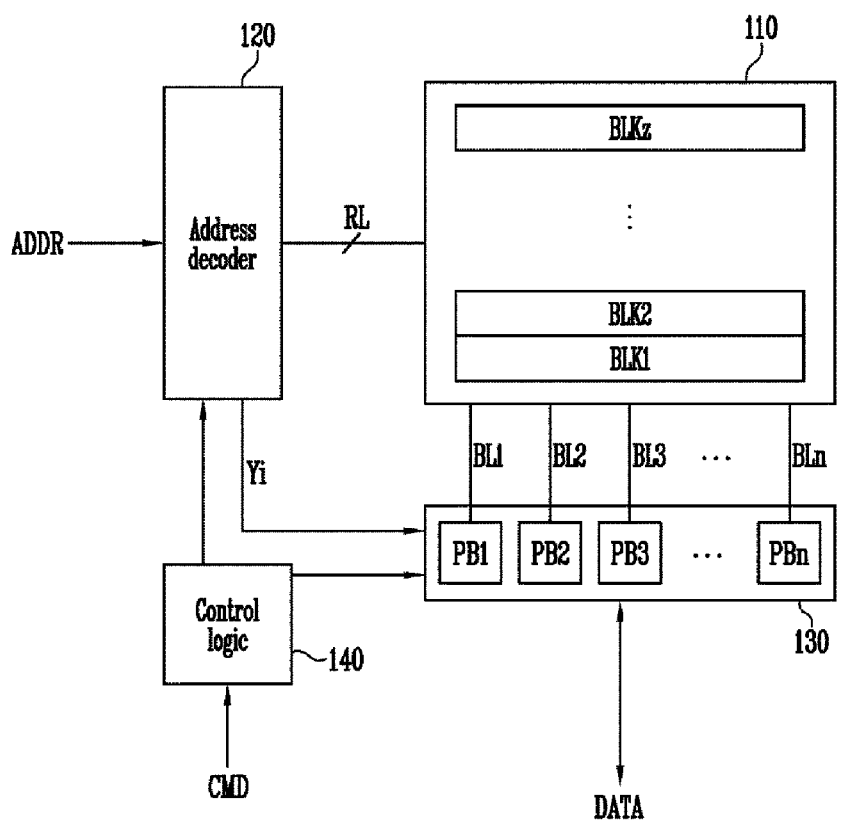
FIG. 2 is a view illustrating detailed constitution of the semiconductor memory device in FIG. 1.

FIG. 2 is a view illustrating detailed constitution of the semiconductor memory device in FIG. 1.

In FIG. 2, the semiconductor memory device 100 may include a memory cell array 110, an address decoder 120, the read and write circuit 130 and a control logic 140.

The memory cell array 110 may include memory blocks BLK1~BLKz. The memory blocks BLK1~BLKz are coupled to the address decoder 120 through row lines RL. The memory blocks BLK1~BLKz are coupled to the read and write circuit 130 through bit lines BL (i.e., BL1 to BLn). Each of the memory blocks BLK1~BLKz may include memory cells. In an embodiment, the memory cells may be non-volatile memory cells.

The address decoder 120, the read and write circuit 130 and the control logic 140 may operate as a peripheral circuit for driving the memory cell array 110.

The address decoder 120 may be coupled to the memory cell array 110 through the row lines RL. The address decoder 120 may operate in response to control of the control logic 140. The address decoder 120 may receive an address ADDR through an input/output buffer (not shown) in the semiconductor memory device 100. The address ADDR may be provided from the controller (200 in FIG. 1).

The address decoder 120 may decode a block address of the received address ADDR. The address decoder 120 may select one or more memory blocks in response to the decoded block address.

The address decoder 120 may decode a row address of the received address ADDR. The address decoder 120 may drive the row lines coupled to a memory block selected in accordance with the decoded row address.

The address decoder 120 may decode column addresses of the received address ADDR. The address decoder 120 may transmit the decoded column address Yi to the read and write circuit 130.

The read operation of the semiconductor memory device may be performed in the unit of a page. The address ADDR received in the read request may include the block address, the row address and the column address. The address decoder 120 may select one memory block and one word line in response to the block address and the row address. The column address may be decoded by the address decoder 120, and the decoded column address may be provided to the read and write circuit 130.

The address decoder 120 may include a block decoder, a row decoder, a column decoder and an address buffer, etc.

The read and write circuit 130 may include page buffers PB1~PBn. The page buffers PB1~PBn may be coupled to the memory cell array 110 through the bit lines BL. The read and write circuit 130 may operate in response to the control of the control logic 140.

The read and write circuit 130 may communicate data DATA with the input/output buffer of the semiconductor memory device 100. In the program operation, the read and write circuit 130 receives data to be programmed and may store the received data in the page buffers PB1~PBn, and may deliver the stored data DATA to bit lines corresponding to the decoded column address Yi of the bit lines BL. The delivered data is programmed in memory cells coupled to a selected word line. In the read operation, the read and write circuit 130 may reads data of selected memory cells through bit lines corresponding to the decoded column address Yi of the bit lines BL and may store the read data in the page buffers PB1~PBn, and output the stored data DATA.

The read and write circuit 130 may perform a pre-read and a main read based on the pre-read when the read operation is performed in response to the read request. In an embodiment, data read by the pre-read may be stored as cache data in the page buffers PB1~PBn, before the main read is performed. In a read operation in accordance with a re-read request, the read and write circuit 130 may omit the pre-read and may perform the main read on the basis of the cache data.

In an embodiment, the read and write circuit 130 may include page buffers (or page registers), a column select circuit, etc.

The control logic 140 may be coupled to the address decoder 120 and the read and write circuit 130. The control logic 140 may receive a command CMD through the input/output buffer of the semiconductor memory device 100. The command CMD is provided from the controller (200 in FIG. 1). The control logic 140 may control the operation of the semiconductor memory device 100 in response to the command CMD.

Figure 3:
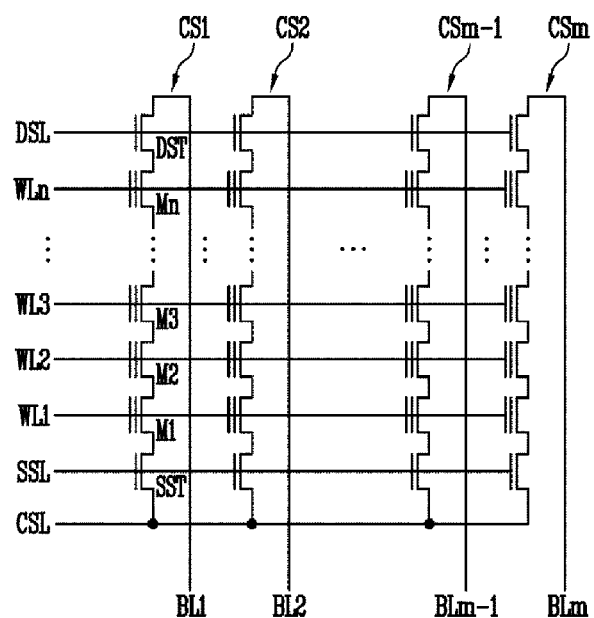
FIG. 3 is a view illustrating one BLK1 of the memory block BLK1~BLKz in FIG. 2.

FIG. 3 is a view illustrating one memory block such as BLK1 of the memory blocks BLK1~BLKz illustrated in FIG. 2.

In FIG. 3, the memory block BLK1 may include cell strings CS1~CSm. The cell strings CS1~CSm may be coupled to a first to an mth bit lines BL1~BLm (where m is a numerical integer), respectively.

Each of the cell strings CS1~CSm may include a source select transistor SST, memory cells M1~Mn (where n is a numerical integer) coupled in serial and a drain select transistor DST. The source select transistor SST is coupled to a source select line SSL. The first to the nth memory cells M1~Mn are coupled to a first to an nth word lines WL1~WLn, respectively. The drain select transistor DST is coupled to a drain select line DSL. A common source line CSL is coupled to a source of the source select transistor SST. Each of the bit lines BL1~BLm is coupled to a drain of corresponding drain select transistor DST. The row lines RL shown in FIG. 2 may include the source select line SSL, the first to the nth word lines WL1~WLn and the drain select line DSL. The source select line SSL, the first to the nth word lines WL1~WLn and the drain select line DSL may be driven by the address decoder 120.

In the read operation, a supply voltage may be supplied to the drain select line DSL and the source select line SSL. For example a ground voltage may be supplied to the common source line CSL. A pass voltage as high voltage may be supplied to word lines not selected, and so corresponding memory cells may be turned on. A read voltage may be supplied to the selected word line, and thus selected memory cells may be turned on or turned off according to their threshold voltages. That is, current passing through a corresponding bit line flows to the common source line CSL accordingly as the selected memory cell is turned on or turned off.

Figure 4:
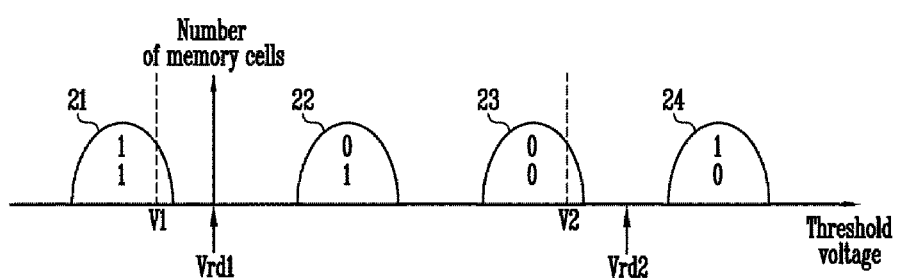
FIG. 4 is a diagram illustrating threshold voltage distribution when two data bit are stored in one memory cell.

FIG. 4 is a diagram illustrating threshold voltage distribution when two data bits are stored in one memory cell. The y-axis displays the Number of memory cells and the x-axis displays the threshold voltage.

In FIG. 4, memory cells include erase state 21 and first to third program states 22~24. In an embodiment, a memory cell 21 having the erase state 21 may store "11", a memory cell having the first program state 22 may store "01", a memory cell having a second program state 23 may store "00", and a memory cell having the third program state 24 may store "10". In other words, least significant bit data of the erase state 21 and the first to the third program states 22~24 are "1", "1", "0" and "0". Most significant bit data of the erase state 21 and the first to the third program states 22~24 are "1", "0", "0" and "1".

Figure 5:
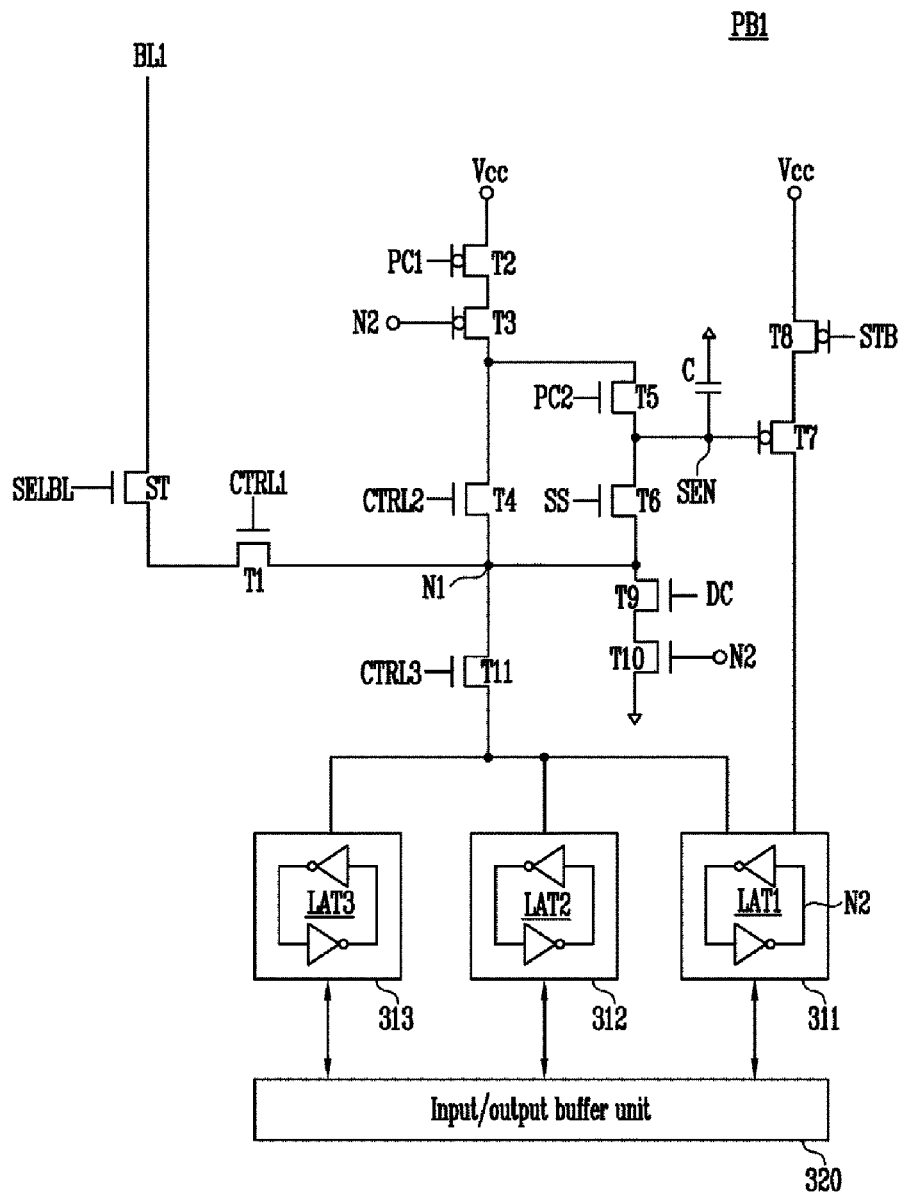
FIG. 5 is a view illustrating one PB1 of the page buffers PB1~PBn in FIG. 3.

FIG. 5 is a view illustrating one page buffer PB1 of the page buffers PB1~PBn illustrated in FIG. 2.

In FIG. 5, a page buffer PB1 may include a first to eleventh transistors T1~T11, first to third latch units 311~313 and an input/output buffer unit 320.

A select transistor ST and a first transistor T1 may be coupled in series between a bit line BL1 and a first node N1. The select transistor ST and the first transistor T1 operate in response to a bit line select signal SELBL and a first control signal CTRL1, respectively.

Second to a fourth transistors T2~T4 may be coupled in series between a node of a supply voltage Vcc (hereinafter, referred to as "supply voltage node") and a first node N1. A gate of the second transistor T2 may receive a first precharge signal PC1, and a third transistor T3 may be coupled to a second node N2. The fourth transistor T4 may operate in response to a second control signal CTRL2.

Fifth and sixth transistors T5 and T6 may be coupled in parallel between the third transistor T3 and the first node N1. The fifth and sixth transistors T5 and T6 may operate in response to a second precharge signal PC2 and a sense signal SS, respectively.

A seventh transistor T7 may be coupled between an eighth transistor T8 and a first latch 311, and its gate may be coupled to a sense node SEN between the fifth transistor T5 and the sixth transistor T6. The eighth transistor T8 may be coupled between the seventh transistor T7 and the supply voltage node Vcc, and may operate in response to a strobe signal STB.

Ninth and tenth transistors T9 and T10 may be coupled in series between the first node N1 and a ground node. The ninth transistor T9 may receive a discharge signal DC. The eleventh transistor T11 may be coupled between the first node N1 and first to third latch units 311~313, and may operate in response to a third control signal CTRL3.

The first to third latch units 311~313 may be coupled between the eleventh transistor T11 and the input/output buffer unit 320, and may communicate data with the input/output buffer unit 320. The first to the third latch units 311~313 may include first to third latches LAT1~LAT3, respectively. The first latch unit 311, for example the second node N2 therein is further coupled to the seventh transistor T7.

Hereinafter, the pre-read and the main read will be described. The read operation to the most significant bit data will be described as an example of the read operation with reference to drawings FIG. 4 and FIG. 5.

The bit line select signal SELBL may be enabled with high level in response to the decoded column address (Yi in FIG. 2), and so a bit line BL1 may be selected. The first control signal CTRL1 may be enabled with high level, and thus the first node N1 may be electrically connected to the bit line BL1.

In the pre-read, the first precharge signal PC1 may be enabled with a low level, and the second precharge signal PC2 and the sense signal SS may be enabled with high level. A discharge signal DC is not enabled with low level. The second node N2 of the first latch unit 311 has logic low and is an initialized state. As a result, the third transistor T3 may be turned on. Accordingly, current, e.g. 300 nA may be applied to the bit line BL1 from the supply voltage node through the third to the sixth transistors T3~T6. In this case, the amount of the current flowing through the bit line BL1 and a voltage of the sense node SEN may be determined according to the degree of selected memory cells turned on in a cell string (CS1 in FIG. 3) and coupled to the bit line BL1. A voltage of the second node N2 may be determined when the strobe signal STB is toggled and data is stored in the first latch LAT1, according to the voltage of the sense node SEN.

Particularly, it may be assumed that a first read voltage Vrd1 is supplied to the selected word line. In the event that the selected memory cell has a threshold voltage higher than the first read voltage Vrd1, the selected memory cell is turned off. In the event that the threshold voltage of the selected memory cell is lower than the first read voltage Vrd1 and higher than a first voltage V1, the selected memory cell may be slightly turned on. In the event that the threshold voltage of the selected memory cell is lower than the first voltage V1, the selected memory cell may be wholly turned on. In the event that the selected memory cell is wholly turned on, the current applied to the bit line BL1 flows through the common source line CSL. The voltage of the sense node SEN may be changed to for example a ground voltage, and thus the seventh transistor T7 may be turned on. The second node N2 stores logic high when the strobe signal STB is toggled. In the event that the selected memory cell is slightly turned on and is turned off, the current applied to the bit line BL1 is not smoothly discharged through the common source line CSL, and thus the seventh transistor T7 is not turned on. In this case, the second node N2 maintains logic low. As a result, in the pre-read using the first read voltage (Vrd1 in FIG. 4), it may be determined that the state of memory cells having a threshold voltage lower than the first voltage (V1 in FIG. 4) is an erase state.

Subsequently, the main read may be performed based on the result of the pre-read, and it may be determined that state of memory cells having threshold voltage between the first voltage V1 and the first read voltage Vrd1 is in an erase stage, by the main read.

Particularly, the precharge signal PC1 may maintain a low level and the discharge signal DC may be enabled with a high level. The second and the ninth transistors T2 and T9 are turned on. In the event that the second node N2 has logic high according to the result of the pre-read, the third transistor T3 may be turned off and the ninth transistor N9 may be turned on. Accordingly, in the event that it is determined that corresponding memory cell has the erase state according to the pre-read, the current is not applied through the bit line BL1. As a result, current flows excessively to the common source line CSL in the main read, and so a source line bouncing phenomenon may be prevented. However, in the event that it is determined that corresponding memory cell does not have the erase state according to the pre-read, the current flows through the bit line BL1.

A capacitor C may be charged accordingly as the fifth and the sixth transistors T5 and T6 are turned on, and then electric charges in the capacitor C may be supplied to the bit line BL1 by turning off the fifth transistor T5. In this case, amount, e.g. 100 nA of the current smaller than in the pre-read may be applied to the bit line BL1, and so the current applied through the bit line BL1 may be smoothly discharged to the common source line CSL though the selected memory cell is slightly turned on. Here, the voltage of the sense node SEN may be changed into for example a ground voltage. However, the current applied to the bit line BL1 may be not discharged in the event that the selected memory cell is turned off. The voltage of the sense node SEN is not changed into the ground voltage. Data may be stored in the first latch LAT1 according to the voltage of the sense node SEN, when the strobe signal STB is toggled. The second control signal CTRL2 may be enabled with a low voltage to provide a current path, so that the voltage of the bit line BL1 is not excessively reduced in the main read.

A read operation using a second read voltage (Vrd2 in FIG. 4) is substantially identical to that using the first read voltage Vrd1, except in that the second read voltage Vrd2 may be supplied to the selected word line.

The most significant bit data may be determined according to the read operation using the first read voltage Vrd1 and the read operation using the second read voltage Vrd2.

Velocity of the read operation may be downed in the event that the pre-read and the main read are performed whenever the read operation is performed. For example, if two read operations are required in the read operation for the most significant bit data, two pre-read and two main read should be performed.

Figure 6:
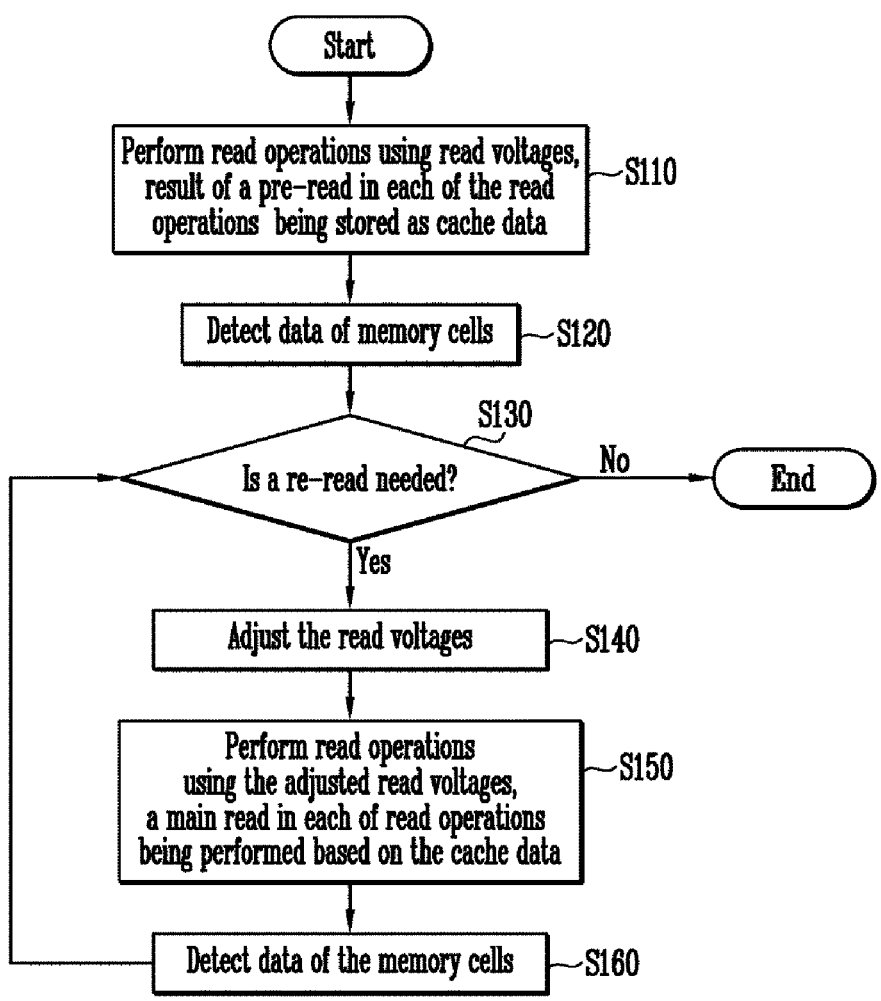
FIG. 6 is a flowchart illustrating a method of operating a memory system according to an embodiment.

FIG. 6 is a flowchart illustrating a method of operating a memory system according to an embodiment. Hereinafter, the method will be described through a read operation for the most significant bit data. However, it will be understood that the present embodiments are not limited to the read operation for the most significant bit data.

In FIG. 1, FIG. 4 and FIG. 6, the semiconductor memory device 100 may perform read operations using read voltages Vrd1 and Vrd2 in step S110. Result of the pre-read performed in each of the read operations may be stored as cache data.

In an embodiment, data read by a pre-read may be stored as a first cache data in the read operation using the first read voltage Vrd1, and data read by a pre-read may be stored as a second cache data in the read operation using the second read voltage Vrd2.

In step S120, the semiconductor memory device 100 detects data of selected memory cells according to data determined by the read operations.

For example, in the event that data of the memory cell in the read operation using the first read voltage Vrd1 is "0" and data of the memory cell in the read operation using the second read voltage Vrd2 is "0", the most significant bit data of the memory cell is "0". In the event that data of the memory cell in the read operation using the first read voltage Vrd1 is "0" and data of the memory cell in the read operation using the second read voltage Vrd2 is "1", the most significant bit data of the memory cell is "1". In the event that data of the memory cell in the read operation using the first read voltage Vrd1 is "1" and data of the memory cell in the read operation using the second read voltage Vrd2 is "1", the most significant bit data of the memory cell is "1".

In step S130, the controller 200 determines whether the re-read is needed.

In an embodiment, in the event that data of the selected memory cells is provided to the controller 200, the controller 200 may detect whether an error in the provided data is detectable and correctable. The re-read is not performed and error bit may be corrected when the number of the error bit is smaller than specified value (i.e., No). In the event that the error bit is not correctable because the number of the error bit is higher than the specified value, the step S140 may be performed (i.e., Yes).

In the step S140, the controller 200 may control the semiconductor memory device 100 to adjust the read voltages Vrd1 and Vrd2. For example, the controller 200 may decrease the read voltages Vrd1 and Vrd2 or increase the read voltages Vrd1 and Vrd2. The read voltages Vrd1 and Vrd2 may be adjusted in response to an algorithm of the controller 200. The semiconductor memory device 100 sets again the read voltages Vrd1 and Vrd2 in response to control of the controller 200.

In step S150, the semiconductor memory device 100 may perform read operations using the adjusted read voltages. In each of the read operations, the pre-read may be omitted and the main read may be performed based on the cache data.

In an embodiment, the main read may be performed based on a first cache data in a read operation using the adjusted first read voltage. The main read may be performed based on a second cache data in a read operation using the adjusted second read voltage.

In step S160, the semiconductor memory device 100 may detect data of the selected memory cells according to data determined by the read operations, and may transmit the detected data to the controller 200.

In an embodiment, the pre-read is not performed and the stored cache data may be used in the read operation according to the re-read request. Accordingly, velocity of the read operation may be enhanced.

Figure 7:
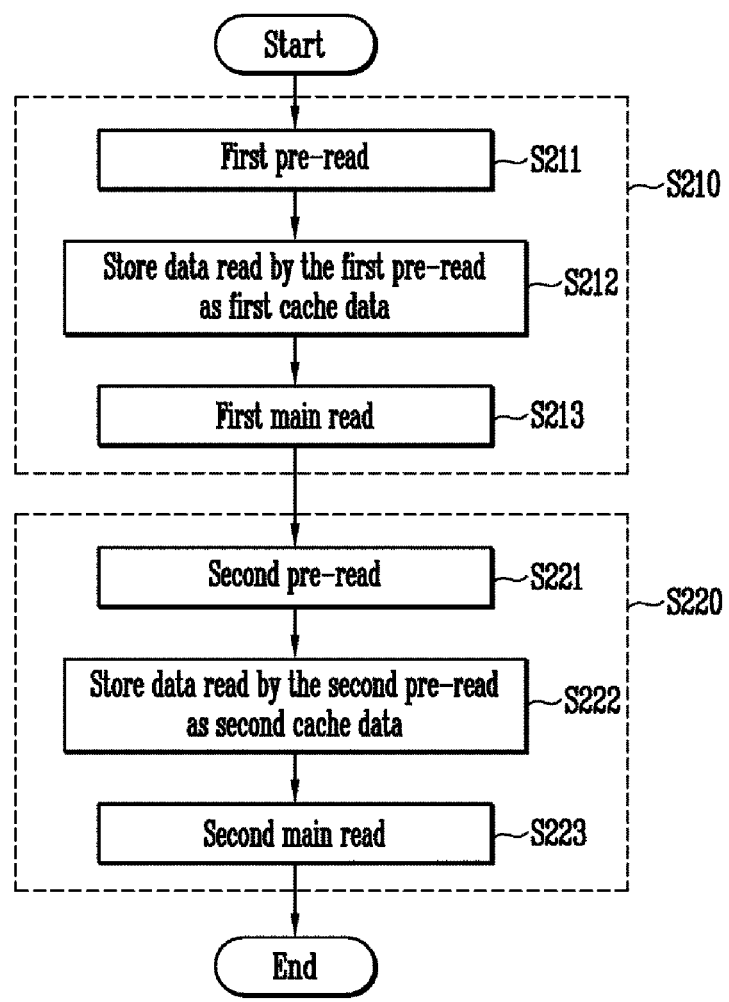
FIG. 7 is a flowchart illustrating in detail the step S110 in FIG. 6.

FIG. 7 is a flowchart illustrating in detail the step S110 in FIG. 6.

In FIG. 2, FIG. 5 and FIG. 7, the read operation is performed by using the first read voltage Vrd1. The first read voltage Vrd1 may be supplied to the selected word line, and a pass voltage as high voltage may be supplied to word lines not selected. The step S210 may include steps S211 to step S213.

In the step S211, a first pre-read may be performed. Data read by the first pre-read may be stored in the first latches (LAT1 in FIG. 5) of the page buffers PB1~PBn. In step S212, the data stored in the first latches by the first pre-read may be copied as the first cache data in the second latches (LAT2 in FIG. 5) of the page buffers PB1~PBn. In the step S213, a first main read may be performed on the basis of the data stored in the first latches as described in FIG. 5, after the first cache data is copied.

In the step S220, the read operation may be performed by using the second read voltage Vrd2. The second read voltage Vrd2 may be supplied to the selected word line, and the pass voltage may be supplied to the word lines not selected. The step S220 may include steps S221 to step S223.

A second pre-read may be performed in the step S221, and the data stored in the first latches of the page buffers PB1~PBn may be copied as the second cache data in third latches of the page buffers PB1~PBn in step S222. In the step S223, a second main read may be performed on the basis of the data stored in the first latches.

FIG. 8 is a flowchart illustrating in detail the step S150 in FIG. 6.

In FIG. 2, FIG. 5 and FIG. 7, a read operation may be performed by using the adjusted first read voltage in step S310. In this case, a pre-read may be omitted and a third main read may be performed on the basis of the first cache data stored in the second latches.

In step S320, a read operation may be performed by using the adjusted second read voltage. In this case, a pre-read may be omitted and a fourth main read may be performed based on the second cache data stored in the third latches.

FIG. 9 is a view illustrating data flow between the first to the third latches LATs1~LATs3 when two reads are performed in response to a read request and a re-read request.

In FIG. 5 and FIG. 9, the read operation may be performed in response to the read request. Data read by a first pre-read may be stored in the first latches LATs1 of the page buffers PB1~PBn in step S10. The data stored in the first latches LATs1 may be copied as a first cache data in second latches LATs2 in step S11. A first main read (step S12) may be performed, and thus the data of the first latches LATs1 may be updated.

A second pre-read may be performed. In step S13, data read by the second pre-read may be stored in the first latches LATs1 of the page buffers PB1~PBn. The data stored in the first latches LATs1 may be copied as a second cache data in the third latches LATs3 in step S14. Data read by the second main read (step S15) may be updated in the first latches LATs1.

In step S16, the first cache data stored in the second latches LATs2 may be transmitted to the first latches LATs1 when the re-read request is received. In the event that a third main read is performed on the basis of the data stored in the first latches LATs1, data read by the third main read may be stored in the first latches LATs1 in step S17. In step S18, the second cache data may be transmitted from the third latches LATs3 to the first latches LATs1 so as to perform a fourth main read in step S18. In step S19, data read by the fourth main read may be updated in the first latches LATs1 in the event that the fourth main read is performed.

Velocity of an operation of transmitting the cache data among the latches is a lot more rapid than that in the pre-read. Accordingly, velocity of the read operation in accordance with the re-read request may be enhanced.

In the event that another command not the re-read request is received from the controller (200 in FIG. 1), the data stored in the second and the third latches LATs2 and LATs3 may be deleted. For example, the second and the third latches LATs2 and LATs3 may be initialized when program request is received from the controller 200. In another embodiment, the second and the third latches LATs2 and LATs3 may be initialized when a read request to other memory cells is received from the controller 200.

Figure 10:
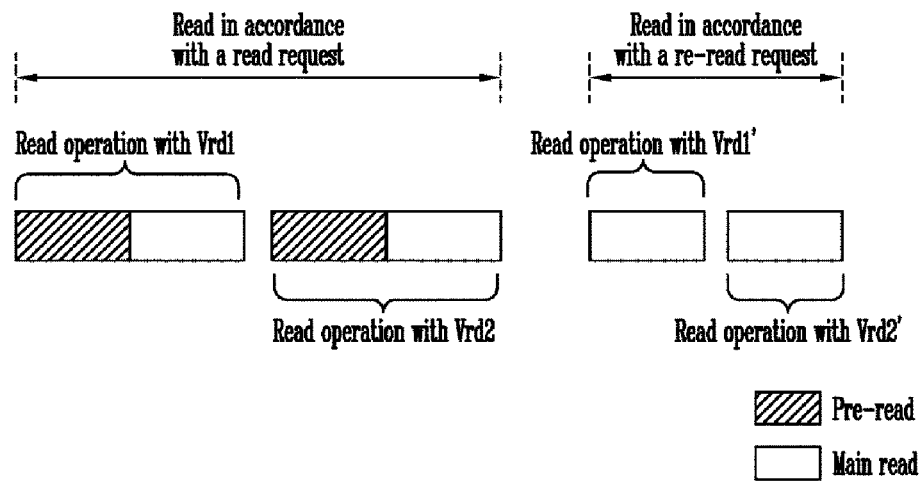
FIG. 10 is a view illustrating conceptually operation of the semiconductor memory device when read operations are performed according to read request and re-read request.

FIG. 10 is a view illustrating conceptually operation of the semiconductor memory device when read operations are performed according to a read request and a re-read request.

In FIG. 10, a read operation using a first read voltage Vrd1 and a read operation using a second read voltage Vrd2 may be performed when the read operation is performed in response to the read request. Here, each of the read operations may include a pre-read and a main read.

In a read operation according to the re-read request, a read operation using an adjusted first read voltage Vrd1' and a read operation using an adjusted second read voltage Vrd2' may be performed. Here, the read operations do not include a pre-read.

Figure 11:
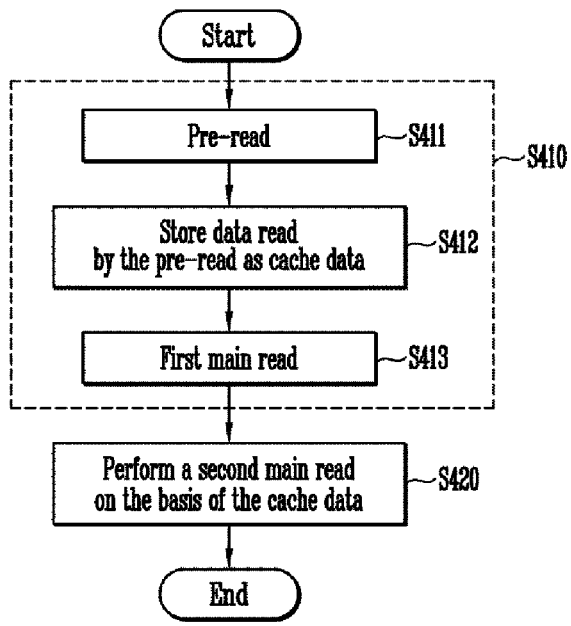
FIG. 11 is a flowchart illustrating a method of operating a memory system according to an embodiment.

FIG. 11 is a flowchart illustrating a method of operating a memory system according to an embodiment.

In FIG. 1, FIG. 4 and FIG. 11, read operations S410 and S420 are required in a read operation to most significant bit data. In the step S410, the semiconductor memory device 100 may perform a read operation using a first read voltage Vrd1. The step S410 may include steps S411 to step S413.

A pre-read may be performed in the step S411. Data read by the pre-read may be stored in the first latch LAT1 under the condition that a first read voltage Vrd1 is supplied to selected word line. In step S412, the data read by the pre-read may be copied as cache data from the first latch LAT1 to the second latch LAT2. A first main read may be performed in the step S413.

In a step S420, the semiconductor memory device 100 may perform a read operation using a read voltage Vrd2. The pre-read is omitted when the read operation may be performed by using the second read voltage Vrd2. Instead of the pre-read, a second main read may be performed on the basis of the data stored in the first latch LAT1, after the stored cache data is loaded to the first latch LAT1.

In an embodiment, the pre-read and the main read may be performed in initial read operation of the read operations in accordance with a read request, and only main read based on the cache data may be performed in following read operation. Accordingly, read velocity of the semiconductor memory device is enhanced.

Figure 12:
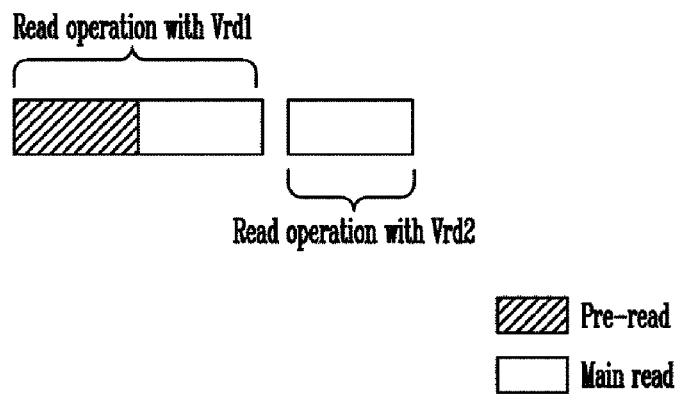
FIG. 12 is a view illustrating conceptually operation of the semiconductor memory device when the read operation in FIG. 11 is performed.

FIG. 12 is a view illustrating conceptually the operation of the semiconductor memory device when the read operation in FIG. 11 is performed.

In FIG. 12, a read operation using a first read voltage Vrd1 and a read operation using a second read voltage Vrd2 may be performed, in response to a read request. A pre-read and a main read may be performed in the read operation using the first read voltage Vrd1, and a main read may be performed and the pre-read is not performed in the read operation using the second read voltage Vrd2. Accordingly, read velocity of the semiconductor memory device 100 is enhanced.

Figure 13:
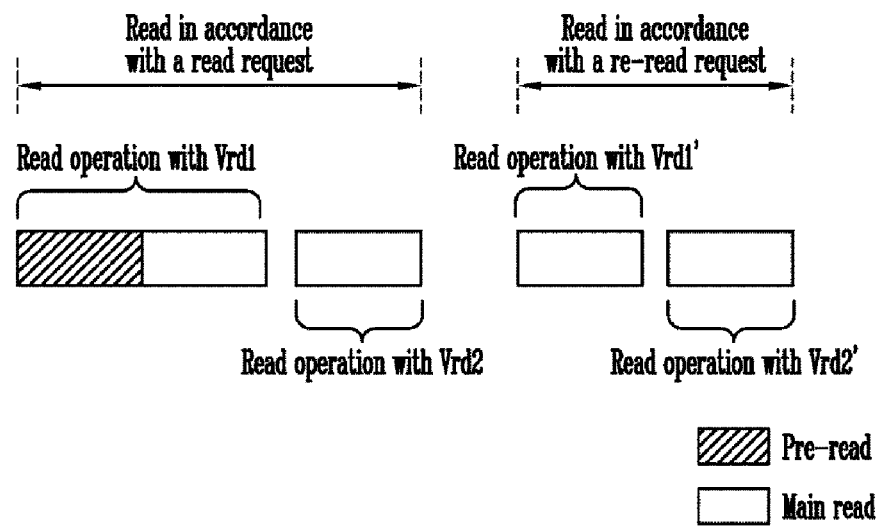
FIG. 13 is a view illustrating conceptually operation of the semiconductor memory device when a read operation is performed according to an embodiment.

FIG. 13 is a view illustrating conceptually operation of the semiconductor memory device when a read operation is performed according to an embodiment.

In FIG. 13, read operations may be performed according to a read request, in the same manner in FIG. 12.

A read operation using an adjusted first read voltage and a read operation using an adjusted second read voltage may be performed when a re-read request about the same memory cells are received. In an embodiment, in each of the read operations using the adjusted first read voltage and the adjusted second read voltage, a pre-read may be omitted and only a main read may be performed on the basis of pre-stored cache data. Accordingly, read velocity in accordance with a re-read request as well as read velocity in accordance with a read request may be enhanced.

Figure 14:
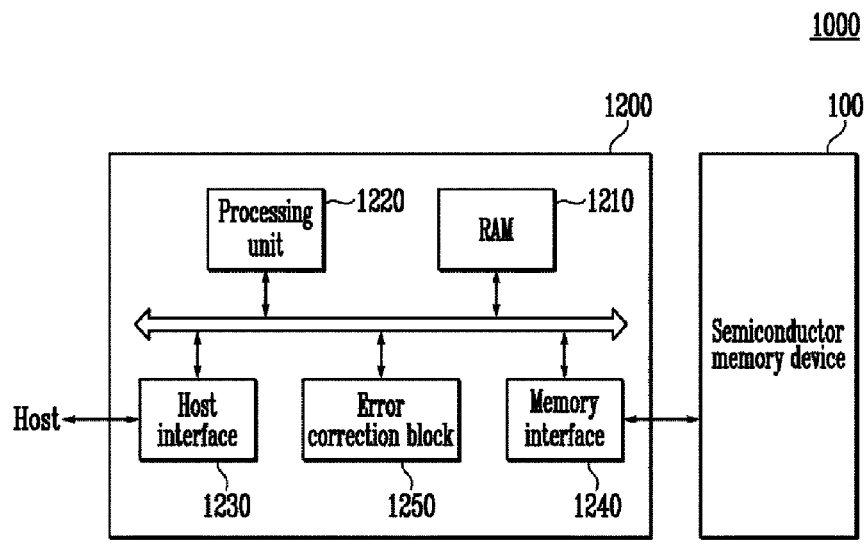
FIG. 14 is a block diagram illustrating a memory system including the semiconductor memory device in FIG. 1.

FIG. 14 is a block diagram illustrating a memory system including the semiconductor memory device in FIG. 1.

In FIG. 14, a memory system 1000 may include the semiconductor memory device 100 and a controller 1200.

The semiconductor memory device 100 may include elements in FIG. 1 and operate as shown in FIG. 1. Hereinafter, any further description concerning the same elements and operation will be omitted.

The controller 1200 may be coupled to a host and the semiconductor memory device 100. The controller 1200 accesses the semiconductor memory device 100 in response to request from the host. For example, the controller 1200 controls a read operation, a program operation, an erase operation and a background operation of the semiconductor memory device 100. The controller 1200 provides interface between the semiconductor memory device 100 and the host. The controller 1200 drives a firmware for controlling the semiconductor memory device 100.

The controller 1200 may include a random access memory RAM 1210, a processing unit 1220, a host interface 1230, a memory interface 1240 and an error correction block 1250. The RAM 1210 is used as one or more of an operation memory of the processing unit 1220, a cache memory between the semiconductor memory device 100 and the host and a buffer memory between the semiconductor memory device 100 and the host. The processing unit 1220 controls operation of the controller 1200.

The host interface 1230 may include a protocol for performing data exchanging between the host Host and the controller 1200. In an embodiment, the controller 1200 communicates with the host through at least one of various interface protocols such as an universal serial bus USB protocol, an multimedia card MMC protocol, a peripheral component interconnection PCI protocol, a PCI-express PCI-E protocol, an advanced technology attachment ATA protocol, a serial-ATA protocol, a parallel-ATA protocol, a small computer small interface SCSI protocol, an enhanced small disk interface ESDI protocol, and integrated drive electronics IDE protocol, a private protocol, etc.

The memory interface 1240 may interface with the semiconductor memory device 100. For example, the memory interface 1240 may include a NAND interface or a NOR interface.

The error correction block 1250 may perform substantially the same function as the error correction block 210 in FIG. 1. The error correction block 1250 detects and corrects error in data received from the semiconductor memory device 100 using an error correction code ECC. The processing unit 1200 adjusts a read voltage in accordance with detection result of the error, and controls the semiconductor memory device 100 to perform a re-read. In an embodiment, the error correction block may be provided as element of the controller 1200.

The controller 1200 and the semiconductor memory device 100 may be integrated in one semiconductor device. In an embodiment, the controller 1200 and the semiconductor memory device 100 may be integrated in one semiconductor device to form a memory card. For example, the controller 1200 and the semiconductor memory device 100 are integrated in one semiconductor device to form a memory card such as a personal computer memory card international association PCMCIA, a compact flash card CF, a smart media card SMC, a memory stick, a multimedia card MMC, RS-MMS, MMCmicro, a SD card SD, miniSD, micro SD, SDHC, an universal flash memory device UFS, etc.

The controller 1200 and the semiconductor memory device 100 may be integrated in one semiconductor device to form a solid state drive SSD. The semiconductor drive SSD may include a storage device for storing data in a semiconductor memory. In the event that the memory system 1000 is used as the semiconductor drive SSD, operation velocity of the host coupled to the memory system 1000 is considerably improved.

In an embodiment, the memory system 1000 is provided as one of various elements of an electronic equipment such as a computer, an ultra mobile PC UMPC, a workstation, a net-book, a personal digital assistants PDA, a portable computer, a web tablet, a wireless phone, a mobile phone, a smart phone, an e-book, a portable multimedia player PMP, a digital camera, a three-dimensional television, a digital audio recorder, a digital audio player, a digital picture recorder, a digital picture player, a digital video recorder, a digital video player, an apparatus for enabling to transmit/receive information in wireless environment, one of various electronic equipments included in home network, one of various electronic equipments included in computer network, one of various electronic equipments included in telematics network, an RFID device or one of elements included in computing system, etc.

In an embodiment, the semiconductor memory device 100 or the memory system 1000 may be variously packaged. For example, the semiconductor memory device 100 or the memory system 1000 may be packaged through methods such as PoP (Package on Package), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package(SSOP), Thin Small Outline(TSOP), Thin Quad Flatpack(TQFP), System In Package(SIP), Multi Chip Package(MCP), Wafer-level Fabricated Package(WFP), Wafer-Level Processed Stack Package(WSP), etc.

Figure 15:
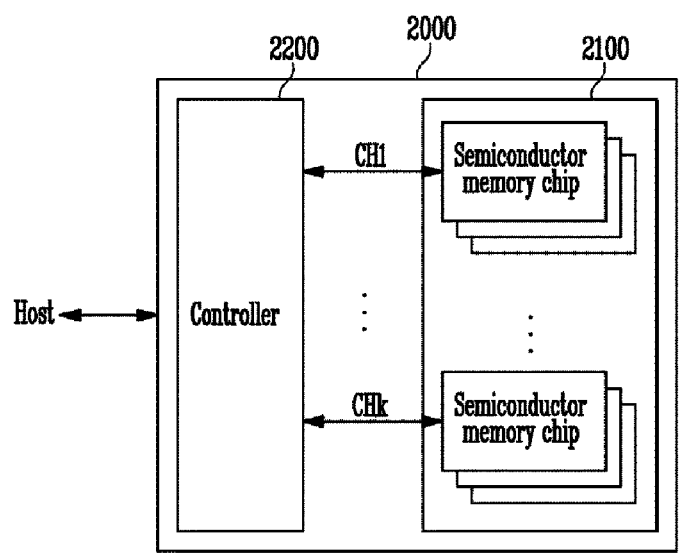
FIG. 15 is a block diagram illustrating application of a memory system in FIG. 14.

FIG. 15 is a block diagram illustrating application of a memory system in FIG. 14.

In FIG. 15, the memory system 2000 may include a semiconductor memory device 2100 and a controller 2200. The semiconductor memory device 2100 may include semiconductor memory chips. The semiconductor memory chips are divided into groups.

In FIG. 15, the groups communicate with the controller 2200 through a first to a kth channels CH1~CHk, respectively (where K, for example, is a numerical integer). Each of the semiconductor memory chips may be substantially identical to one of the semiconductor memory device 100 described in FIG. 1 and operate as in FIG. 1.

Each of the groups communicates with the controller 2200 through one common channel. The controller 2200 is substantially identical to the controller 1200 in FIG. 14, and controls memory chips of the semiconductor memory device 2100 through the channels CH1~CHk.

In FIG. 15, semiconductor memory chips are coupled to one channel. However, one semiconductor memory chip may be coupled to one channel.

Figure 16:
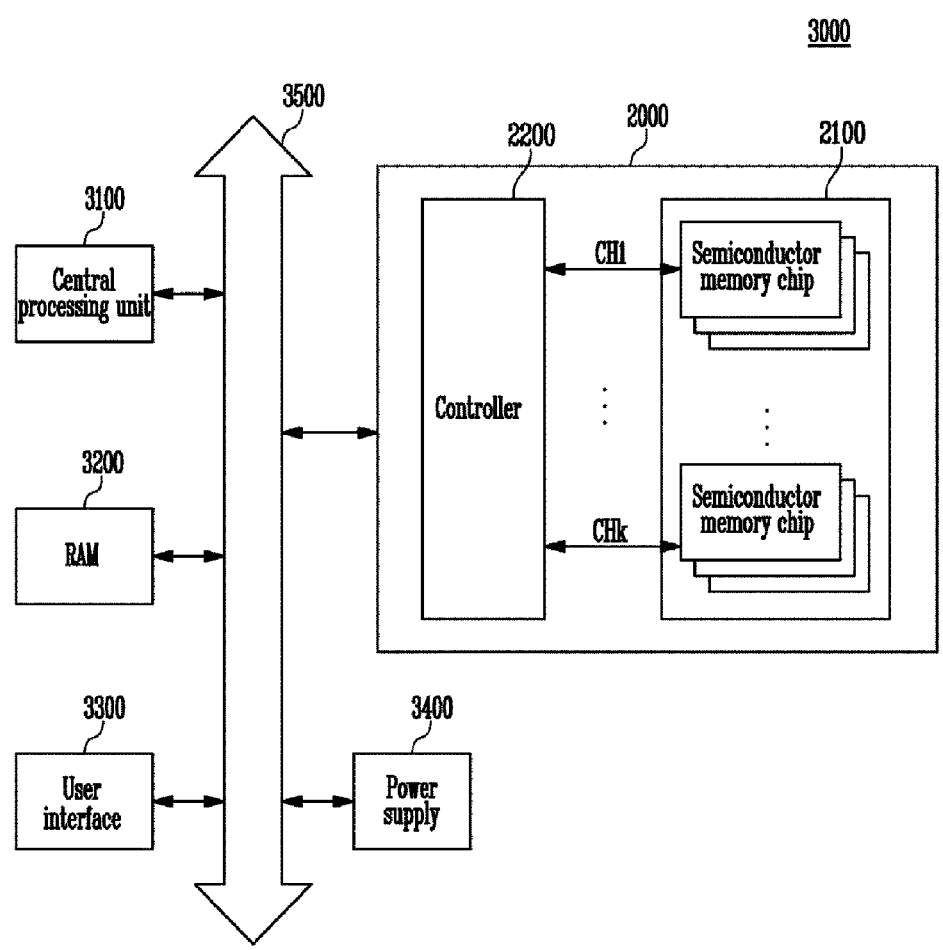
FIG. 16 is a block diagram illustrating a computing system including the memory system in FIG. 15.

FIG. 16 is a block diagram illustrating a computing system including the memory system in FIG. 15.

In FIG. 16, a computing system 3000 may include a central processing unit 3100, a RAM 3200, a user interface 3300, a power supply 3400, a system bus 3500 and the memory system 2000.

The memory system 2000 is electrically coupled to the central processing unit 3100, the RAM 3200, the user interface 3300 and the power supply 3400 through the system bus 3500. Data provided through the user interface 3300 or processed by the central processing unit 3100 is stored in the memory system 2000.

In FIG. 16, the semiconductor memory device 2100 is coupled to the system bus 3500 through the controller 2200. However, the semiconductor memory device 2100 may be directly connected to the system bus 3500. Here, function of the controller 2200 may be performed by the central processing unit 3100 and the RAM 3200.

In FIG. 16, the memory system 2000 described in FIG. 15 is provided. However, the memory system 2000 may be replaced with the memory system 1000 in FIG. 14. In an embodiment, the computing system 3000 may include every memory system 1000 and 2000 described in FIG. 14 and FIG. 15.

In an embodiment, result of the pre-read performed in the first read operation is stored as cache data, and the pre-read is omitted in the second read operation. The main read in the second read operation is performed based on the cache data. Accordingly, read velocity of the semiconductor memory device may be enhanced.

Although embodiments have been described with reference to a number of illustrative embodiments thereof, it should be understood that numerous other modifications and embodiments can be devised by those skilled in the art that will fall within the spirit and scope of the principles of this disclosure.

What is claimed is:

1. A method of operating a semiconductor memory device, the method comprising:
    performing a first pre-read and a first main read based on the first pre-read to selected memory cells in response to a read request, data read by the first pre-read being stored as cache data;
    receiving a re-read request; and
    in response to the re-read request, performing a second main read to the selected memory cells using the cache data from the first pre-read, thereby omitting a second pre-read to the selected memory cells.

2. The method of claim 1, wherein the cache data is stored in latches.

3. The method of claim 1, wherein the performing of the first pre-read and the first main read includes:
    storing data read by the first pre-read in first latches; and
    performing the first main read through bit lines, on the basis of the data stored in the first latches.

4. The method of claim 3, wherein the performing of the first pre-read and the first main read further includes copying the data stored in the first latches in second latches before the first main read is performed,
    and wherein the data stored in the second latches is the cache data.

5. The method of claim 4, wherein the performing of the second main read includes:
    transmitting the cache data from the second latches to the first latches; and
    performing the second main read through the bit lines, on the basis of the cache data stored in the first latches.

6. The method of claim 1, wherein the re-read request is provided when the number of error bit in data read by the first pre-read and the first main read is higher than a specified value.

7. A method of operating a memory system including memory cells defined as a multi level cell, the method comprising:
    performing a first pre-read and a first main read based on the first pre-read when a first read voltage is supplied to a word line of selected memory cells, data read by the first pre-read being stored as first cache data;
    performing a second pre-read and a second main read based on the second pre-read when a second read voltage is supplied to the word line, data read by the second pre-read being stored as second cache data;
    adjusting the first read voltage and the second read voltage;
    performing a third main read based on the first cache data when the adjusted first read voltage is supplied to the word line; and
    performing a fourth main read based on the second cache data when the adjusted second read voltage is supplied to the word line.

8. The method of claim 7, wherein a pre-read to the selected memory cell is omitted in the performing of the third main read and the performing of the fourth main read.

9. The method of claim 7, wherein the performing of the first pre-read and the first main read includes:
    storing data read by the first pre-read through bit lines in first latches;
    copying the data stored in the first latches in second latches; and
    performing the first main read through the bit lines, on the basis of the data stored in the first latches,
    and wherein data stored in the second latches is the first cache data.

10. The method of claim 9, wherein the performing of the second pre-read and the second main read includes:
    storing data read by the second pre-read through the bit lines in the first latches;
    copying the data stored in the first latches in third latches; and
    performing the second main read through the bit lines, on the basis of the data stored in the first latches,
    and wherein data stored in the third latches is the second cache data.

11. The method of claim 10, wherein the performing of the third main read includes:
    transmitting the first cache data from the second latches to the first latches; and
    performing the third main read through the bit lines, on the basis of the first cache data stored in the first latches.

12. The method of claim 10, wherein the performing of the fourth main read includes:
    transmitting the second cache data from the third latches to the first latches; and
    performing the fourth main read through the bit lines, on the basis of the second cache data stored in the first latches.

13. The method of claim 7, wherein data stored in the selected memory cells is determined according to result of the first main read and result of the second main read, and the first read voltage and the second read voltage are adjusted when the number of error bit in the detected data is higher than specified value.

14. The method of claim 13, wherein the third main read and the fourth main read are performed in response to a re-read request, and the re-read request is generated when the number of error bit in the detected data is greater than the specified value.

15. A memory system comprising:
a semiconductor memory device including memory cells and a read and write circuit coupled to the memory cells through bit lines; and
a controller configured to control the semiconductor memory device,
wherein the semiconductor memory device is configured to perform a first pre-read and a first main read based on the first pre-read to the selected memory cells in response to a read request from the controller, and data read by the first pre-read is stored as first cache data in the read and write circuit,
wherein the semiconductor memory device is further configured to perform a second pre-read and a second main read based on the second pre-read to the selected memory cells in response to the read request, and data read by the second pre-read is stored as second cache data in the read and write circuit, and
wherein a first read voltage is applied to a word line coupled to the selected memory cells when the first pre-read and the first main read are performed, and a second read voltage higher than the first read voltage is applied to the word line when the second pre-read and the second main read are performed.

16. The memory system of claim 15, wherein the controller transmits a re-read request to the semiconductor memory device, and the semiconductor memory device is configured to perform a third main read to the selected memory cells based on the first cache data and a fourth main read to the selected memory cells based on the second cache data in response to the re-read request.

17. The memory system of claim 15, wherein the controller is configured to control the semiconductor memory device to adjust the first and the second read voltages according to a result of the first and second main reads and to transmit a re-read request to the semiconductor memory device, and
wherein the semiconductor memory device is configured to perform a third main read based on the first cache data when the adjusted first read voltage is applied to the word line, and to perform a fourth main read based on the second cache data when the adjusted second read voltage is applied to the word line.

18. The memory system of claim 15, wherein the read and write circuit includes page buffers coupled to the bit lines, respectively, and the page buffers include first latches and second latches, and
wherein data read by the first pre-read is stored in the first latches, the first main read is performed based on the data stored in the first latches, and the data stored in the first latches is copied as the first cache data in the second latches before the first main read is performed.

19. The memory system of claim 18, wherein the first cache data is transmitted from the second latches to the first latches when the re-read request is received, and the second main read is performed based on the cache data stored in the first latches.

* * * * *